United States Patent
Lee

(10) Patent No.: US 12,119,038 B2
(45) Date of Patent: Oct. 15, 2024

(54) AUTO REFRESH LIMITING CIRCUIT FOR SEMICONDUCTOR MEMORY DEVICE

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 240 days.

(21) Appl. No.: 17/963,671

(22) Filed: Oct. 11, 2022

(65) Prior Publication Data

US 2023/0260563 A1   Aug. 17, 2023

(30) Foreign Application Priority Data

Feb. 15, 2022   (KR) ......................... 10-2022-0019488

(51) Int. Cl.
*G11C 11/40* (2006.01)
*G11C 11/406* (2006.01)
*H03K 19/20* (2006.01)

(52) U.S. Cl.
CPC .............. *G11C 11/40611* (2013.01); *G11C 11/40615* (2013.01); *H03K 19/20* (2013.01)

(58) Field of Classification Search
CPC ................................................ G11C 11/40611
See application file for complete search history.

(56) References Cited

U.S. PATENT DOCUMENTS

2023/0260563 A1*   8/2023   Lee ................... G11C 11/40611
                                                                        365/222

* cited by examiner

Primary Examiner — Jason Lappas
(74) Attorney, Agent, or Firm — KILE PARK REED & HOUTTEMAN PLLC

(57) ABSTRACT

An auto refresh limiting circuit includes an oscillating signal generating part that generates an internal oscillating signal, the internal oscillating signal being a pulse having a period reflecting an internal temperature of a semiconductor memory device; a masking signal generating part that generates a masking signal by using an auto refresh command signal and the internal oscillating signal, the masking signal being deactivated during a pulse of the auto refresh command signal, the pulse of the auto refresh command signal being first generated after the pulse of the internal oscillating signal is generated; and an auto refresh masking part that converts the pulse of the auto refresh command signal into a pulse of an auto refresh driving signal, the conversion of the pulse of the auto refresh driving signal being masked according to the activation of the masking signal.

20 Claims, 5 Drawing Sheets

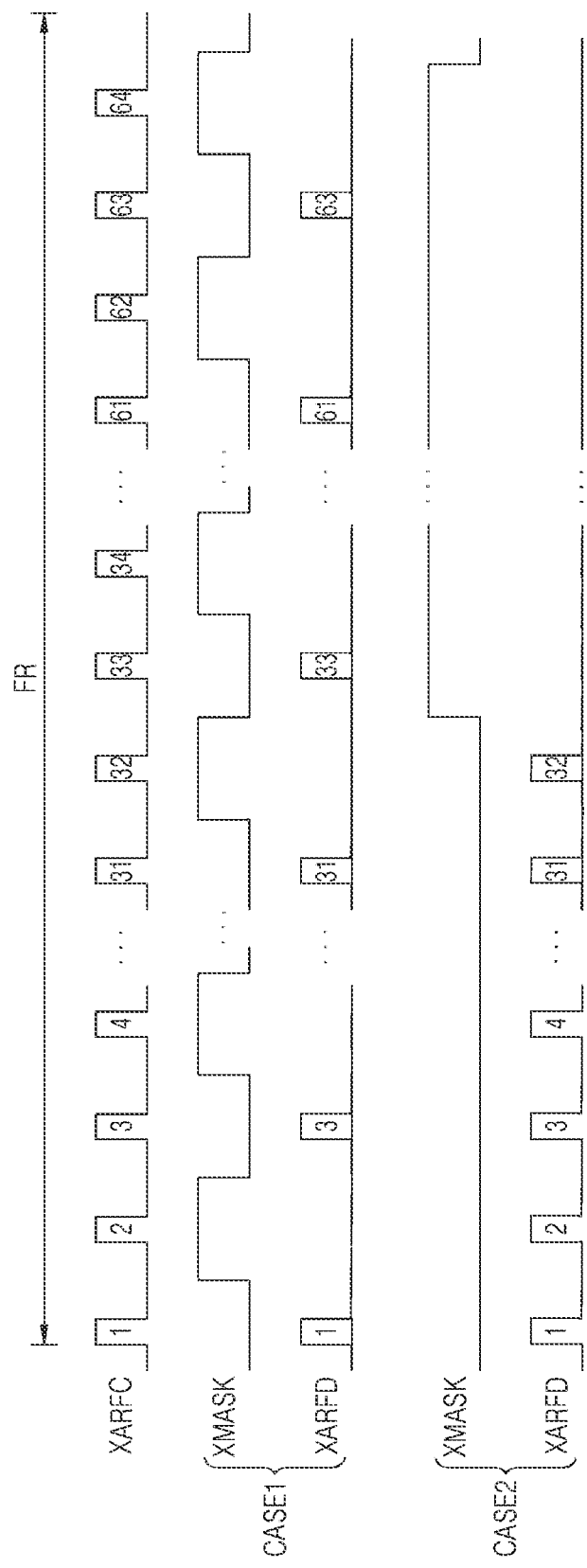

AUTO REFRESH LIMITING CIRCUIT FOR SEMICONDUCTOR MEMORY DEVICE

CROSS-REFERENCE TO RELATED APPLICATION

This application claims priority to and the benefit of Korean Patent Application No. 10-2022-0019488 under 35 U.S.C. § 119, filed in the Korean Intellectual Property Office (KIPO) on Feb. 15, 2022, the disclosure of which is incorporated herein by reference in its entirety.

BACKGROUND

1. Technical Field

The disclosure relates to an electronic circuit, and more specifically, to an auto refresh limiting circuit for a semiconductor memory device.

2. Description of the Related Art

In general, a semiconductor memory device, such as DRAM, is configured to include memory cells. Each of memory cells is formed of a cell capacitor and a cell transistor, and stores data by charging the cell capacitor.

It may be desirable that the amount of charge stored in the cell capacitor is maintained constant. However, the charge stored in the cell capacitor can be lost due to leakage current, etc., which results in data loss. The leakage current may increase as the internal temperature of the semiconductor memory device increases.

To prevent such data loss, in the semiconductor memory device, such as DRAM, a refresh operation that recharges the data stored in the cell capacitor may be performed. In the refresh operation, a large amount of current may be consumed.

As the refresh operation, for example, refresh and/or auto refresh may be used.

Self-refresh operation may be performed with a refresh cycle according to the pulse cycle of an internal oscillating signal. An internal oscillating signal may be generated from the oscillator implemented in the semiconductor memory device. The pulse cycle of an internal oscillating signal may be dependent on the internal temperature of the semiconductor memory device. Therefore, the period of the self-refresh may be dependent on the internal temperature of the semiconductor memory device.

On the other hand, auto refresh operation may be performed with a refresh cycle according to the pulse of an auto refresh command signal provided from an external system. The cycle of the auto refresh may be significantly shorter than that of the self-refresh.

In case of the semiconductor memory device widely used in recent electronic devices, the capacity and speed are increasing. Accordingly, the power consumption of the semiconductor memory device is also increasing. In particular, in case of portable electronic devices, it is very important to reduce the power consumption of the semiconductor memory device.

Therefore, it is required to properly adjust the number of actual executions of the auto refresh for the pulse generation of the auto refresh command signal.

SUMMARY

The disclosure is directed to an auto refresh limiting circuit for a semiconductor memory device to properly adjust the number of actual executions of the auto refresh for the pulse generation of the auto refresh command signal.

According to an aspect of the disclosure, there is provided an auto refresh limiting circuit for a semiconductor memory device.

The auto refresh limiting circuit according to an aspect of the disclosure comprises an oscillating signal generating part that generates an internal oscillating signal, the internal oscillating signal being a pulse having a period reflecting an internal temperature of a semiconductor memory device; a masking signal generating part that generates a masking signal by using an auto refresh command signal and the internal oscillating signal, the auto refresh command signal being provided from an outside and generated in a form of a pulse, the masking signal being deactivated during a pulse of the auto refresh command signal, and the pulse of the auto refresh command signal being first generated after the pulse of the internal oscillating signal is generated; and an auto refresh masking part that converts the pulse of the auto refresh command signal into a pulse of an auto refresh driving signal, the conversion of the pulse of the auto refresh driving signal being masked according to an activation of the masking signal.

A pulse period of the internal oscillating signal may correspond to a pulse period of a self-refresh driving signal of the semiconductor memory device.

The masking signal may be deactivated in response to a leading edge of the pulse of the internal oscillating signal, and may be activated in response to a trailing edge of the pulse of the auto refresh command signal.

The masking signal generating part may include a preliminary signal generating part that generates a preliminary signal, the preliminary signal being activated in response to a leading edge of the auto refresh command signal, and being deactivated in delayed response to a trailing edge of the auto refresh command signal; and a masking latch part that generates the masking signal, the masking signal being latched in an inactivate state in response to a leading edge of the internal oscillating signal, and is activated in response to a trailing edge of the preliminary signal.

The auto refresh command signal may be activated as "H" in a form of a pulse, and the preliminary signal generating part may include an inversion delay part that inverts and delays the auto refresh command signal; and a preliminary NOR gate that performs NORing of the auto refresh command signal and an output of the inversion delay part to generate the preliminary signal.

The internal oscillating signal may be activated as "H" in a form of a pulse, and the masking latch part may include a first masking NOR gate that performs NORing of the preliminary signal and the masking signal; and a second masking NOR gate that performs NORing of the internal oscillating signal and an output of the first masking NOR gate to generate the masking signal.

According to other aspect of the disclosure, there is provided an auto refresh limiting circuit for a semiconductor memory device.

The auto refresh limiting circuit according to other aspect of the disclosure comprises an oscillating signal generating part that generates an internal oscillating signal, the internal oscillating signal being a pulse having a period reflecting an internal temperature of a semiconductor memory device; a masking signal generating part that generates a masking signal by using an auto refresh command signal and the internal oscillating signal, the auto refresh command signal being provided from an outside and generated in a form of a pulse, the masking signal being deactivated during a period corresponding to an allowable ratio, the allowable ratio being a number of pulses of the internal oscillating signal with respect to a number of pulses of the auto refresh command signal; and an auto refresh masking part that converts the pulse of the auto refresh command signal into the pulse of an auto refresh driving signal, the conversion of the pulse of an auto refresh driving signal being masked according to an activation of the masking signal.

A pulse period of the internal oscillating signal may correspond to a pulse period of a self-refresh driving signal of the semiconductor memory device.

The masking signal generating part may include a command pulse counter that counts the pulse of the auto refresh command signal during a counting time; an internal pulse counter that counts the pulse of the internal oscillating signal during the counting time; and a masking signal generating part that generates the masking signal by using a number of pulses counted in the command pulse counter and the internal pulse counter, and the masking signal is activated and deactivated depending on an allowable ratio.

The masking signal generating part may store information of the allowable ratio.

The masking signal may be repeatedly activated and deactivated depending on the pulse of the auto refresh command signal during a unit frame period in which a number of memory cells are refreshed.

The masking signal may be continuously activated and continuously deactivated depending on the pulse of the auto refresh command signal during a unit frame period in which a number of memory cells are refreshed.

During the unit frame period, a period in which the masking signal is activated and a period in which even-numbered pulse of the auto refresh command signal may overlap each other, and a period in which the masking signal is deactivated and a period in which odd-numbered pulse of the auto refresh command signal may overlap each other.

During the unit frame period, a period in which the masking signal is deactivated and a period in which first-half of the auto refresh command signal may overlap each other, and a period in which the masking signal is activated and a period in which second-half of the auto refresh command signal may overlap each other.

A semiconductor memory device comprises an auto refresh limiting circuit comprising an oscillating signal generating part that generates an internal oscillating signal, the internal oscillating signal being a pulse having a period reflecting an internal temperature of the semiconductor memory device; a masking signal generating part that generates a masking signal by using an auto refresh command signal and the internal oscillating signal, the auto refresh command signal being provided from an outside and generated in a form of a pulse, the masking signal being deactivated during a pulse of the auto refresh command signal, the pulse of the auto refresh command signal being first generated after the pulse of the internal oscillating signal is generated; and an auto refresh masking part that converts the pulse of the auto refresh command signal into a pulse of an auto refresh driving signal, the conversion of the pulse of the auto refresh driving signal being masked according to an activation of the masking signal.

A pulse period of the internal oscillating signal may correspond to a pulse period of a self-refresh driving signal of the semiconductor memory device.

The masking signal may be deactivated in response to a leading edge of the pulse of the internal oscillating signal, and may be activated in response to a trailing edge of the pulse of the auto refresh command signal.

The masking signal generating part may include a preliminary signal generating part that generates a preliminary signal, the preliminary signal being activated in response to a leading edge of the auto refresh command signal, and being deactivated in delayed response to a trailing edge of the auto refresh command signal; and a masking latch part that generates the masking signal, the masking signal being latched in an inactivate state in response to a leading edge of the internal oscillating signal, and is activated in response to a trailing edge of the preliminary signal.

The auto refresh command signal may be activated as "H" in a form of a pulse, and the preliminary signal generating part may include an inversion delay part that inverts and delays the auto refresh command signal; and a preliminary NOR gate that performs NORing of the auto refresh command signal and an output of the inversion delay part to generate the preliminary signal.

The internal oscillating signal may be activated as "H" in a form of a pulse, and the masking latch part may include a first masking NOR gate that performs NORing of the preliminary signal and the masking signal; and a second masking NOR gate that performs NORing of the internal oscillating signal and an output of the first masking NOR gate to generate the masking signal.

The technical objectives to be achieved by the disclosure are not limited to those described herein, and other technical objectives that are not mentioned herein would be clearly understood by a person skilled in the art from the description of the disclosure.

BRIEF DESCRIPTION OF THE DRAWINGS

The above and other objects, features and advantages of the disclosure will become more apparent to those skilled in the art by describing in detail some of embodiments thereof with reference to the accompanying drawings, in which:

FIG. 5 is a schematic diagram illustrating a method of activating a masking signal according to an allowable ratio.

DETAILED DESCRIPTION OF THE EMBODIMENTS

Some of the embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular forms such as "a" and "an" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be The action (or operation) of the auto refresh limiting circuit of the disclosure is described below.

Action of Auto Refresh Limiting Circuit

Figure 1:
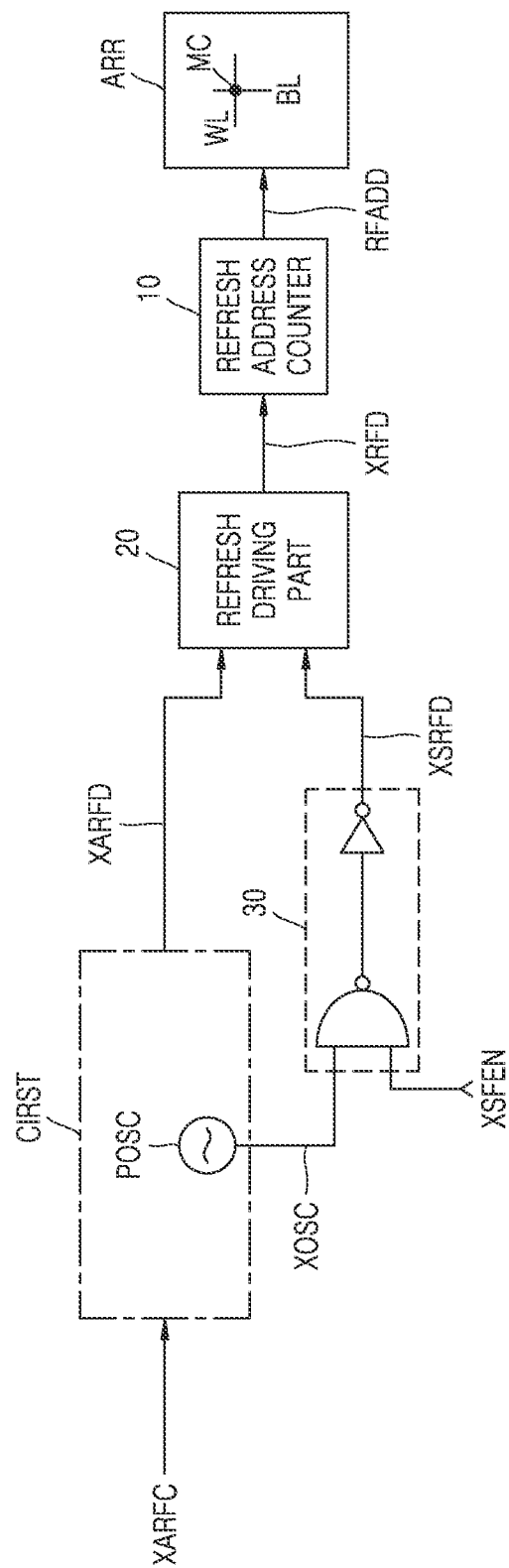
FIG. 1 is a schematic conceptual diagram illustrating the action of an auto refresh limiting circuit of the disclosure in a semiconductor memory device.

FIG. 1 is a schematic diagram illustrating the action of an auto refresh limiting circuit CIRST of the disclosure in a semiconductor memory device.

The semiconductor memory device of the disclosure may include a memory array ARR having memory cells MC. Each of the memory cells MC may be specified by a word line WL and a bit line BL. Each of the memory cells MC may be a volatile device. Accordingly, a refresh operation may be required for each of the memory cells MC to maintain the stored data.

This refresh operation may proceed according to activation of the word line WL specified by the refresh address RFADD, which is generated from a refresh address counter 10. In this case, the refresh address RFADD may be sequentially changed according to the pulse of a refresh driving signal (or selected refresh driving signal) XRFD.

As the refresh operation, self-refresh and/or auto refresh may be used.

In the auto refresh, the refresh operation for the memory cells MC may proceed (or may be performed) according to the generation of the pulse of the auto refresh driving signal XARFD. In the self-refresh, the refresh operation for the memory cells MC may proceed according to the generation of the pulse of the self-refresh driving signal XSRFD.

For example, the refresh driving part 20 may provide one of the auto refresh driving signal XARFD and the self-refresh driving signal XSRFD as the refresh driving signal XRFD, according to the refresh operation mode.

The self-refresh generation part 30 may be enabled according to the activation of "H" of a self-refresh enable signal XSFEN. The self-refresh driving signal XSRFD generated from the self-refresh generation part 30 may have a pulse according to the pulse of an internal oscillation signal XOSC.

The pulse of the internal oscillation signal XOSC may be generated with a period that reflects the internal temperature of the semiconductor memory device.

Due to the auto refresh limiting circuit CIRST of the disclosure, only a part of the pulses of an auto refresh command signal XARFC may be provided as the pulses of the self-refresh driving signal XSRFD. The auto refresh command signal XARFC may be provided from an external system. The auto refresh limiting circuit CIRST of the disclosure may include an oscillating signal generation part POSC for generating the internal oscillation signal XOSC.

Hereinafter, embodiments of the disclosure will be described in detail with reference to the accompanying drawings.

First Embodiment

Figure 2:
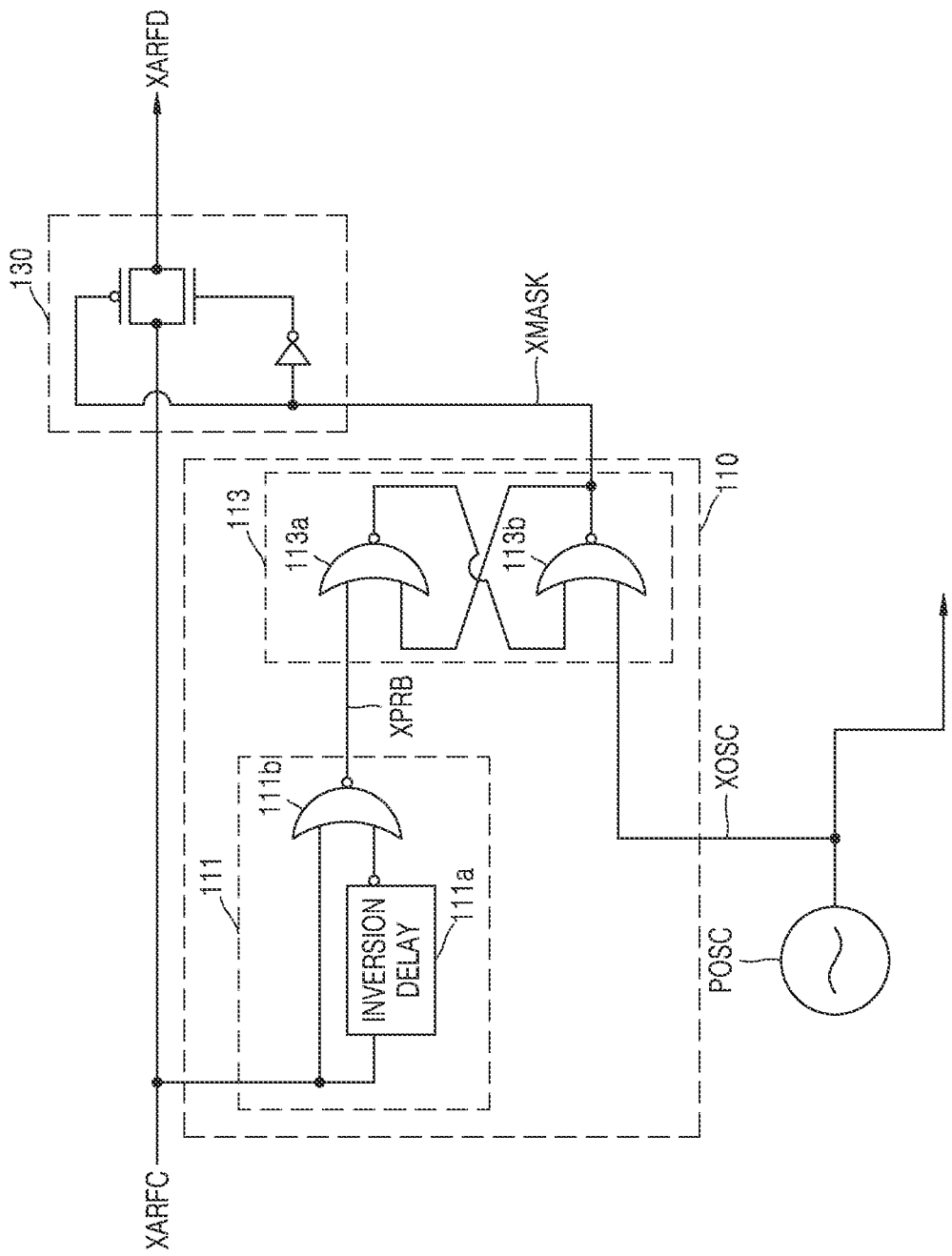
FIG. 2 is a schematic diagram illustrating the auto refresh limiting circuit according to a first embodiment of the disclosure.

FIG. 2 is a schematic diagram illustrating the auto refresh limiting circuit according to a first embodiment of the disclosure. Referring to FIG. 2, the auto refresh limiting circuit according to the first embodiment of the disclosure may include an oscillating signal generating part POSC, a masking signal generating part 110, and an auto refresh masking part 130.

The oscillating signal generating part POSC may generate an internal oscillating signal XOSC. The pulse period of the internal oscillating signal XOSC may reflect the internal temperature of the semiconductor memory device. The pulse period of the internal oscillating signal XOSC may correspond to the pulse period of the self-refresh driving signal XSRFD (see FIG. 1), of the semiconductor memory device. The internal oscillating signal XOSC may be activated in case that it is in the "H" state.

The implementation of the oscillating signal generating part POSC will be understood by those skilled in the art from this disclosure. Therefore, in this specification, further description thereof is omitted for the sake of simplicity.

The masking signal generating part 110 may generate a masking signal XMASK with an auto refresh command signal XARFC and the internal oscillating signal XOSC. The auto refresh command signal XARFC may be provided from the outside and generated in the form of a pulse. In this embodiment, the pulse of the auto refresh command signal XARFC may be activated in case that it is in the "H" state.

The masking signal generating part 110 may include a preliminary signal generating part 111 and a masking latch part 113.

The preliminary signal generating part 111 may receive the auto refresh command signal XARFC, and may generate a preliminary signal XPRB. The preliminary signal XPRB may be activated as "L" in form of a pulse.

The preliminary signal generating part 111 may include an inversion delay part 111a and a preliminary NOR gate 111b.

The inversion delay part 111a may invert and delay the auto refresh command signal XARFC. The preliminary NOR gate 111b may perform NORing of the auto refresh command signal XARFC and the output of the inversion delay part 111a to generate the preliminary signal XPRB.

Figure 3:
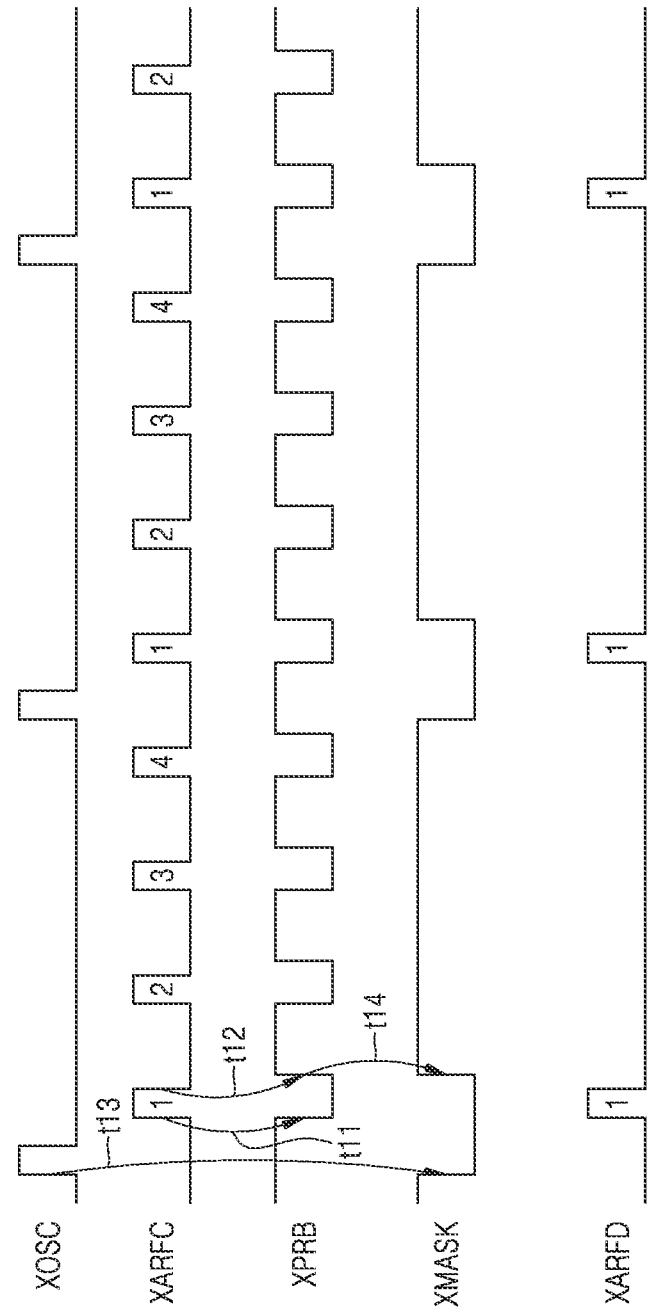
FIG. 3 is a schematic timing diagram of main signals in the auto refresh limiting circuit of FIG. 2.

Accordingly, the preliminary signal XPRB may be activated as "L" in response to the leading edge of the auto refresh command signal XARFC (see t11 in FIG. 3). In this embodiment, the leading edge of the auto refresh command signal XARFC is the edge of the activation to "H".

The preliminary signal XPRB may be deactivated as "H" in delayed response to the trailing edge of the auto refresh command signal XARFC (see t12 in FIG. 3). In this embodiment, the trailing edge of the auto refresh command signal XARFC is the edge of the deactivation to "L".

The masking latch part 113 may generate the masking signal XMASK. The masking latch part 113 may include a first making NOR gate 113a and a second masking NOR gate 113b.

The first making NOR gate 113a performs NORing of the preliminary signal XPRB and the masking signal XMASK. The second masking NOR gate 113b may perform NORing of the internal oscillating signal XOSC and the output of the first NOR gate 113a to generate the masking signal XMASK.

Accordingly, the masking signal XMASK may be latched in the inactivate state of "L" in response to the leading edge of the internal oscillating signal XOSC (see t13 in FIG. 3). In this embodiment, the leading edge of the internal oscillating signal XOSC may be the edge of the activation to "H".

The masking signal XMASK may be activated in response to the trailing edge of the preliminary signal XPRB (see t14 in FIG. 3). In this embodiment, the trailing edge of the preliminary signal XPRB may be the edge of the deactivation to "H".

For example, the masking signal XMASK may be in the deactivated state of "L" during the pulse of the auto refresh command signal XARFC that is generated first after the pulse of the internal oscillating signal XOSC is generated.

In the masking signal generating part 110, the masking signal XMASK may be deactivated to "L" in response to the leading edge of the pulse of the internal oscillating signal XOSC. The masking signal XMASK may be activated to "H" in response to the trailing edge of the pulse of the auto refresh command signal XARFC.

The auto refresh masking part 130 may convert the pulse of the auto refresh command signal XARFC into the pulse of an auto refresh driving signal XARFD. The pulse generation of the auto refresh driving signal XARFD may be masked according to the activation of the masking signal XMASK.

In summary, in the auto refresh limiting circuit according to the first embodiment, after the pulse of the internal oscillating signal XOSC is generated, the first pulse of the auto refresh command signal XARFC may be converted as the pulse of the refresh driving signal XARFD. The rest of the pulses of the auto refresh command signal XARFC may not be reflected in the pulse of the refresh driving signal XARFD.

As a result, in the semiconductor memory device having the auto refresh limiting circuit of the first embodiment, the number of auto refreshes may be properly adjusted according to the internal temperature. So, the overall current consumption may be reduced.

However, the embodiments of the disclosure are not limited thereto. The semiconductor memory device including the auto refresh limiting circuit of the first embodiment can be modified in various forms.

Second Embodiment

Figure 4:
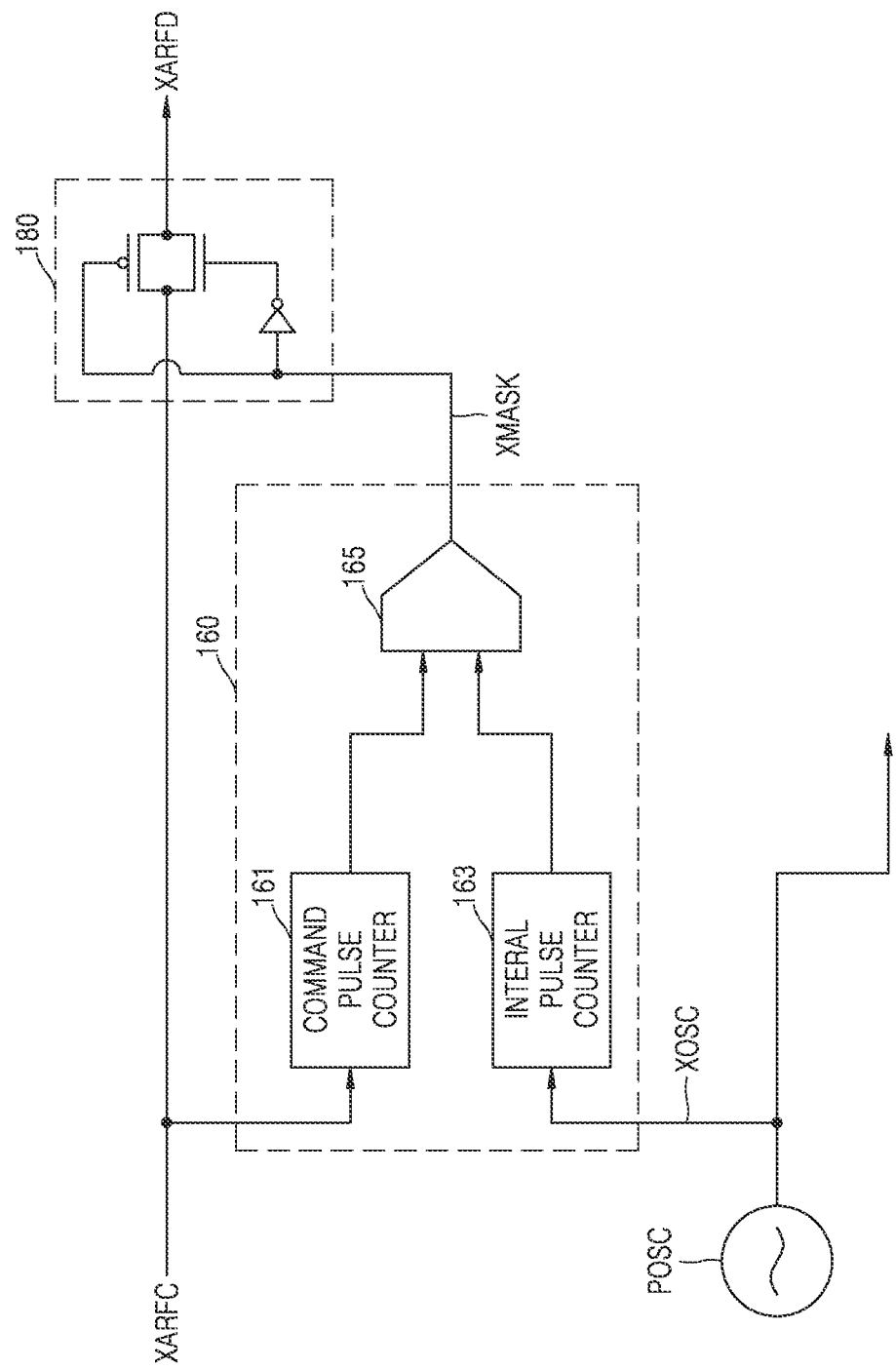
FIG. 4 is a schematic diagram illustrating the auto refresh limiting circuit according to a second embodiment of the disclosure.

FIG. 4 is a schematic diagram illustrating the auto refresh limiting circuit according to a second embodiment of the disclosure. Referring to FIG. 4, the auto refresh limiting circuit according to the second embodiment of the disclosure may include an oscillating signal generating part POSC, a masking signal generating part 160, and an auto refresh masking part 180.

The oscillating signal generating part POSC may generate an internal oscillating signal XOSC. The pulse period of the internal oscillating signal XOSC may reflect the internal temperature of the semiconductor memory device. The pulse period of the internal oscillating signal XOSC may correspond to the pulse period of the self-refresh driving signal XSRFD (see FIG. 1) of the semiconductor memory device. The internal oscillating signal XOSC may be activated in case that it is in the "H" state.

The masking signal generating part 160 may generate a masking signal XMASK with an auto refresh command signal XARFC and the internal oscillating signal XOSC. The auto refresh command signal XARFC may be provided from the outside and generated in the form of a pulse. In this embodiment, the pulse of the auto refresh command signal XARFC may be activated in case that it is in the "H" state.

The masking signal generating part 160 may include a command pulse counter 161, an internal pulse counter 163, and a masking signal generating part 165.

The command pulse counter 161 may count the pulse of the auto refresh command signal XARFC during a counting time, and the internal pulse counter 163 may count the pulse of the internal oscillating signal XOSC during the counting time.

The masking signal generating part 165 may the masking signal XMASK by using the number of the pulses counted in the command pulse counter 161 and the internal pulse counter 163. The masking signal XMASK may be activated and deactivated depending on (or based on or in connection with) an allowable ratio (RAT).

The allowable ratio (RAT) may correspond to the ratio of the number of pulses of the internal oscillating signal XOSC based on the number of pulses of the auto refresh command signal XARFC, in the counting time.

The masking signal generating part 165 may store the information of the allowable ratio (RAT).

The implementation of the command pulse counter 161, the internal pulse counter 163, and the masking signal generating part 165 will be understood by those skilled in the art from this disclosure. Therefore, in this specification, further description thereof is omitted for the sake of simplicity.

In the masking signal generating part 160, the masking signal XMASK may be deactivated with "L" in a section corresponding to the allowable ratio (RAT). The masking signal XMASK may be activated with "H" during the remaining section.

The auto refresh masking part 180 may convert the pulse of the auto refresh command signal XARFC into the pulse of an auto refresh driving signal XARFD. The pulse generation of the auto refresh driving signal XARFD may be masked according to the activation of the masking signal XMASK.

The activation of the masking signal XMASK according to the allowable ratio (RAT) can be implemented in various ways.

FIG. 5 is a schematic diagram illustrating a method of activating the masking signal XMASK according to the allowable ratio (RAT).

FIG. 5 illustrates an example embodiment in which the allowable ratio (RAT) is '1/2'. However, the embodiments are not limited thereto, and the allowable ratio (RAT) may vary (e.g., '1/3', '1/4', etc.).

In FIG. 5, a unit frame period FR may be defined as a section in which one refresh operation is performed for a number of the memory cells (e.g., a predetermined or selectable number of the memory cells) in the semiconductor memory device.

For example, FIG. 5 illustrates an embodiment in which the number of word lines for memory cells MC to be refreshed is '64'.

CASE 1 indicates that the masking signal XMASK is alternatively performed with deactivation and activation depending on the pulse of the auto refresh command signal XARFC during the unit frame period FR.

In CASE 1, the masking signal XMASK may be deactivated at odd numbered pulses 1, 3, 5, . . . , 63 of the auto refresh command signal XARFC. The masking signal XMASK may be activated at even numbered pulses 2, 4, 6, . . . , 64 of the auto refresh command signal XARFC.

Accordingly, the odd-numbered pulses of the auto refresh command signal XARFC may be converted as the pulses of the auto refresh driving signal XARFD. The even-numbered pulses of the refresh driving signal XARFD may not be reflected in the pulse of the refresh driving signal XARFD.

CASE 2 indicates that the masking signal XMASK is continuously performed with deactivation and activation depending on the pulse of the auto refresh command signal XARFC during the unit frame period FR.

In CASE 2, the masking signal XMASK is deactivated at the $1^{st}$ to the $32^{nd}$ pulses of the auto refresh command signal XARFC. The masking signal XMASK may be activated at the $33^{rd}$ to the $64^{th}$ of the auto refresh command signal XARFC.

Accordingly, the $1^{st}$ to the $32^{nd}$ pulses of the auto refresh command signal XARFC may be converted as the $1^{st}$ to the $32^{nd}$ of the auto refresh driving signal XARFD. The rest of the pulses of the auto refresh command signal XARFC may not be reflected in the pulse of the refresh driving signal XARFD.

In summary, in the auto refresh limiting circuit according to the second embodiment, the number of pulses of the auto refresh command signal XARFC corresponding to the allowable ration (RAT) may be converted as the pulse of the refresh driving signal XARFD. The rest of the pulses of the auto refresh command signal XARFC may not be reflected in the pulse of the refresh driving signal XARFD.

As a result, in the semiconductor memory device having the auto refresh limiting circuit of the second embodiment, the number of auto refreshes may be properly adjusted according to the internal temperature. So, the overall current consumption may be reduced.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. An auto refresh limiting circuit comprising:
   an oscillating signal generating part that generates an internal oscillating signal, the internal oscillating signal being a pulse having a period reflecting an internal temperature of a semiconductor memory device;
   a masking signal generating part that generates a masking signal by using an auto refresh command signal and the internal oscillating signal, the auto refresh command signal being provided from an outside and generated in a form of a pulse, the masking signal being deactivated during a pulse of the auto refresh command signal, the pulse of the auto refresh command signal being first generated after the pulse of the internal oscillating signal is generated; and
   an auto refresh masking part that converts the pulse of the auto refresh command signal into a pulse of an auto refresh driving signal, the conversion of the pulse of the auto refresh driving signal being masked according to an activation of the masking signal.

2. The auto refresh limiting circuit of claim 1, wherein a pulse period of the internal oscillating signal corresponds to a pulse period of a self-refresh driving signal of the semiconductor memory device.

3. The auto refresh limiting circuit of claim 1, wherein the masking signal is deactivated in response to a leading edge of the pulse of the internal oscillating signal, and is activated in response to a trailing edge of the pulse of the auto refresh command signal.

4. The auto refresh limiting circuit of claim 1, wherein the masking signal generating part includes:
   a preliminary signal generating part that generates a preliminary signal, the preliminary signal being activated in response to a leading edge of the auto refresh command signal, and being deactivated in delayed response to a trailing edge of the auto refresh command signal; and
   a masking latch part that generates the masking signal, the masking signal being latched in an inactivate state in response to a leading edge of the internal oscillating signal, and is activated in response to a trailing edge of the preliminary signal.

5. The auto refresh limiting circuit of claim 4, wherein the auto refresh command signal is activated as "H" in a form of a pulse, and
   the preliminary signal generating part includes:
   an inversion delay part that inverts and delays the auto refresh command signal; and
   a preliminary NOR gate that performs NORing of the auto refresh command signal and an output of the inversion delay part to generate the preliminary signal.

6. The auto refresh limiting circuit of claim 4, wherein the internal oscillating signal is activated as "H" in a form of a pulse, and
   the masking latch part includes:
   a first masking NOR gate that performs NORing of the preliminary signal and the masking signal; and
   a second masking NOR gate that performs NORing of the internal oscillating signal and an output of the first masking NOR gate to generate the masking signal.

7. An auto refresh limiting circuit comprising:
   an oscillating signal generating part that generates an internal oscillating signal, the internal oscillating signal being a pulse having a period reflecting an internal temperature of a semiconductor memory device;
   a masking signal generating part that generates a masking signal by using an auto refresh command signal and the internal oscillating signal, the auto refresh command signal being provided from an outside and generated in a form of a pulse, the masking signal being deactivated during a period corresponding to an allowable ratio, the allowable ratio being a number of pulses of the internal oscillating signal with respect to a number of pulses of the auto refresh command signal; and an auto refresh masking part that converts the pulse of the auto refresh command signal into the pulse of an auto refresh driving signal, the conversion of the pulse of an auto refresh driving signal being masked according to an activation of the masking signal.

8. The auto refresh limiting circuit of claim 7, wherein a pulse period of the internal oscillating signal corresponds to a pulse period of a self-refresh driving signal of the semiconductor memory device.

9. The auto refresh limiting circuit of claim 7, wherein the masking signal generating part includes:
   a command pulse counter that counts the pulse of the auto refresh command signal during a counting time;
   an internal pulse counter that counts the pulse of the internal oscillating signal during the counting time; and
   a masking signal generating part that generates the masking signal by using a number of pulses counted in the command pulse counter and the internal pulse counter, and
   the masking signal is activated and deactivated depending on an allowable ratio.

10. The auto refresh limiting circuit of claim 9, wherein the masking signal generating part stores information of the allowable ratio.

11. The auto refresh limiting circuit of claim 7, wherein the masking signal is repeatedly activated and deactivated depending on the pulse of the auto refresh command signal during a unit frame period in which a number of memory cells are refreshed.

12. The auto refresh limiting circuit of claim 7, wherein the masking signal is continuously activated and continuously deactivated depending on the pulse of the auto refresh command signal during a unit frame period in which a number of memory cells are refreshed.

13. The auto refresh limiting circuit of claim 11, wherein during the unit frame period,
   a period in which the masking signal is activated and a period in which even-numbered pulse of the auto refresh command signal overlap each other, and
   a period in which the masking signal is deactivated and a period in which odd-numbered pulse of the auto refresh command signal overlap each other.

14. The auto refresh limiting circuit of claim 12, wherein during the unit frame period,
   a period in which the masking signal is deactivated and a period in which first-half of the auto refresh command signal overlap each other, and
   a period in which the masking signal is activated and a period in which second-half of the auto refresh command signal overlap each other.

15. A semiconductor memory device comprising:
an auto refresh limiting circuit comprising:
   an oscillating signal generating part that generates an internal oscillating signal, the internal oscillating signal being a pulse having a period reflecting an internal temperature of the semiconductor memory device;
   a masking signal generating part that generates a masking signal by using an auto refresh command signal and the internal oscillating signal, the auto refresh command signal being provided from an outside and generated in a form of a pulse, the masking signal being deactivated during a pulse of the auto refresh command signal, the pulse of the auto refresh command signal being first generated after the pulse of the internal oscillating signal is generated; and
   an auto refresh masking part that converts the pulse of the auto refresh command signal into a pulse of an auto refresh driving signal, the conversion of the pulse of the auto refresh driving signal being masked according to an activation of the masking signal.

16. The semiconductor memory device of claim 15, wherein a pulse period of the internal oscillating signal corresponds to a pulse period of a self-refresh driving signal of the semiconductor memory device.

17. The semiconductor memory device of claim 15, wherein the masking signal is deactivated in response to a leading edge of the pulse of the internal oscillating signal, and is activated in response to a trailing edge of the pulse of the auto refresh command signal.

18. The semiconductor memory device of claim 15, wherein the masking signal generating part includes:
   a preliminary signal generating part that generates a preliminary signal, the preliminary signal being activated in response to a leading edge of the auto refresh command signal, and being deactivated in delayed response to a trailing edge of the auto refresh command signal; and
   a masking latch part that generates the masking signal, the masking signal being latched in an inactivate state in response to a leading edge of the internal oscillating signal, and is activated in response to a trailing edge of the preliminary signal.

19. The semiconductor memory device of claim 18, wherein
   the auto refresh command signal is activated as "H" in a form of a pulse, and
   the preliminary signal generating part includes:
      an inversion delay part that inverts and delays the auto refresh command signal; and
      a preliminary NOR gate that performs NORing of the auto refresh command signal and an output of the inversion delay part to generate the preliminary signal.

20. The semiconductor memory device of claim 18, wherein
   the internal oscillating signal is activated as "H" in a form of a pulse, and
   the masking latch part includes:
      a first masking NOR gate that performs NORing of the preliminary signal and the masking signal; and
      a second masking NOR gate that performs NORing of the internal oscillating signal and an output of the first masking NOR gate to generate the masking signal.

* * * * *